United States Patent [19]

Marchisi

[11] Patent Number: 4,467,522
[45] Date of Patent: Aug. 28, 1984

[54] PROCESS FOR MANUFACTURING PLASTIC CONTAINERS INCORPORATING A HEAT DISPERSER FOR INTEGRATED CIRCUITS

[76] Inventor: Giuseppe Marchisi, Via A. Pecorini, 8, 20100-Milano, Italy

[21] Appl. No.: 367,602

[22] Filed: Apr. 12, 1982

[30] Foreign Application Priority Data

Apr. 11, 1981 [IT] Italy ................................ 21117 A/81

[51] Int. Cl.³ ............................................. H05K 3/32
[52] U.S. Cl. ....................................... 29/827; 29/588; 29/840; 29/841; 264/272.15; 264/272.17
[58] Field of Search ................. 29/588, 827, 841, 840; 174/52 PE; 357/81; 264/272.17, 272.14, 272.15

[56] References Cited

U.S. PATENT DOCUMENTS 3,646,409  2/1972  van de Water et al.
3,930,114  12/1975  Hodge .............................. 29/588 X
4,066,839  1/1978  Cossuta et al. ................. 29/588 X
4,368,168  1/1983  Slepcevic .................... 264/272.17 X Primary Examiner—Carl E. Hall
Attorney, Agent, or Firm—Wenderoth, Lind & Ponack

[57] ABSTRACT

A metal mass serving as a heat disperser is placed in a die in which a number of plastic containers are to be die-cast at each outlet hole of the extractors in the die. The thrust surfaces of the extractors have a central depression and the dispersers have a projection matching the depression.

1 Claim, 3 Drawing Figures

PROCESS FOR MANUFACTURING PLASTIC CONTAINERS INCORPORATING A HEAT DISPERSER FOR INTEGRATED CIRCUITS

TEXT OF THE DESCRIPTION

The present invention concerns plastic or synthetic resin containers for integrated circuits and, more specifically, a process for manufacturing containers incorporating a metal mass in the plastic body to facilitate the removal and dispersion of the heat generated by the integrated circuit during its operation.

According to a known process, a series of containers of the type defined above and described, for example, in U.S. Pat. No. 3,646,409, is manufactured by performing the following operations:

Sheet metal is cut so as to obtain a strip comprising a series of identical aligned structures, each having a central support area and a number of flat conductors;

A chip of semiconductor material containing an integrated circuit is welded to each support area;

Predetermined areas in each integrated circuit are electrically connected to predetermined conductors;

For each structure in the sheet metal strip, a metal mass, which acts as a heat disperser, is welded to the sheet metal surface opposite the support area;

The sheet metal strip with the semiconductor chips and the heat dispersers welded to it is then encased in resin in an appropriate die, so that one surface in the dispersers remains free of resin.

According to such known process, the application of the heat disperser requires several additional operations in comparison with the basic process for containers without disperser, namely the exact positioning of the metal mass on the sheet metal strip, welding of said mass and, at the end of die-casting, cleaning the outer surface of the disperser to prevent unavoidable resin flash due to the imperfect adhesion of said disperser to the die.

The main purpose of the present invention is to obtain a process of the type defined earlier in which the positioning of the disperser relative to the sheet metal strip is automatic, which does not require welding it to the strip and avoids resin flash on the outer surface of the disperser.

Another purpose of the invention is to suggest a combination of die and dispersers usable with the new process.

These and other purposes are achieved through the process and the combination defined and characterized in the claims at the end of the present description.

The invention will be better understood from the following detailed description of an application, shown as an example, and therefore not limiting its scope, of the new process and of the new combination of die and dispersers, with reference to the attached drawings, where:

Figure 1:
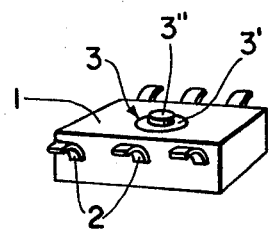
FIG. 1 shows, in perspective and enlarged, a plastic container manufactured according to the process covered by the invention.

Examining the drawings, where the same reference numbers in the various figures refer to the same components, FIG. 1 shows a container, of the so-called "dual-in-line" type, comprising a resin body 1, 6 feet, indicated by No. 2, and a heat disperser 3. The latter has a ring-shaped surface 3' substantially on the same plane as the larger exposed surface of the container and a cylindrical projection 3". It should be pointed out that the container in FIG. 1 can be advantageously mounted on a printed circuit or thick film circuit, by welding the terminal part of the feet and projection 3" in the disperser to appropriate metallized areas in said circuit.

Figure 2:
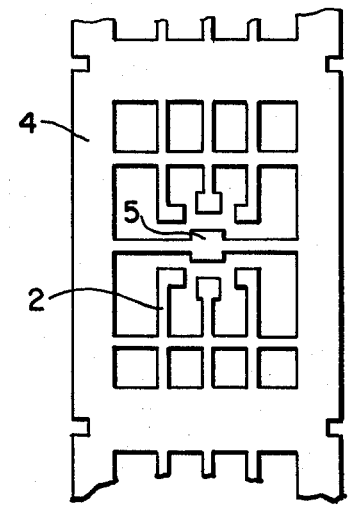
FIG. 2 shows an enlargement of a sheet metal strip, pierced in a usual pattern, used in manufacturing a container such as shown in FIG. 1.
Figure 3:
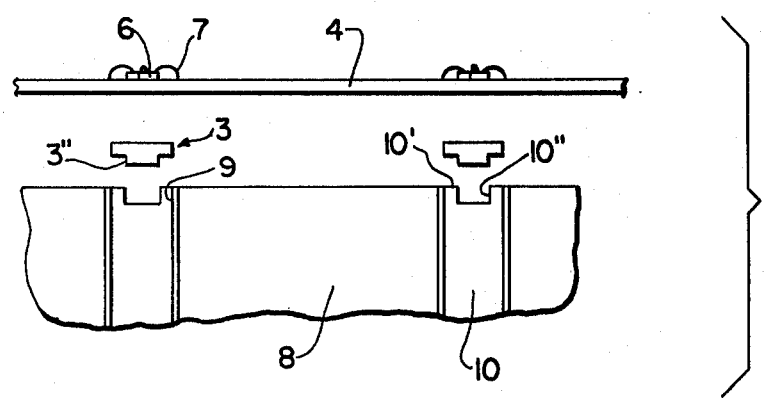
FIG. 3 shows a cross-section of part of a die with two contiguous extractors, two dispersers and a piece of metal strip of the type shown in FIG. 2, with the various parts separate for the sake of clarity in the illustration.

The container in FIG. 1 is manufactured by first obtaining from a sheet metal strip 4 (FIG. 2), by shearing or chemical engraving, a support area 5 for a silicon chip, containing an integrated circuit, and two series of conductors, or feet, indicated by 2 in the figures, parallel to each other and arranged along two opposite sides of the support area 5. Subsequently, the chip, not shown in FIG. 2 to simplify the drawing, but shown and indicated by 6 in FIG. 3, is welded to the support area 5 and some predetermined areas in said chip are connected to the feet 2 by means of thin wires 7 (FIG. 3). The operations described above are a part of a common manufacturing process for plastic containers of the "dual-in-line" type. According to such known process, the strip 4, complete with chip 6 and wires 7, is inserted into an appropriate die in which resin in liquid form, for example a thermosetting polymer, is die-cast. Once the resin has hardened and the die is opened, a series of small pistons, called extractors, which slide in appropriate cylinders built in the die, usually equal in number to the number of pieces to be cast, start operating by applying pressure against the central area in the resin body of each container, so as to facilitate the detachment of the pieces from the die.

The process according to the invention differs from the known one described above in that, before placing the strip 4 in the die, indicated by 8 in FIG. 3, a heat disperser 3, in the form of a small metal disk having a cylindrical projection 3", is placed on each outlet hole 9 of the extractors 10. According to a feature of the invention, the thrust surface of the extractors 10 has a ring 10' and a depression 10" which fit the ring 3' and the projection 3" in the dispersers.

Thus, thanks to the depression 10" and projection 3", the dispersers 3 are positioned easily and automatically relative to the die, and therefore relative to the sheet metal strip 4, and, thanks to the rings 3' and 10' which adhere exactly to each other, all resin flash on the disperser during the die-casting operation is eliminated.

After die-casting, the strip 4, with the resin bodies formed on it, is removed from the die in the usual manner and subjected to the usual operations of shearing and bending of the feet, so as to obtain a number of finished containers such as that shown in FIG. 1.

According to a variant of the invention, the dispersers might have a projection such as that indicated by 3" also on the opposite face of the disk, in order to make the structure symmetrical and thus further facilitate the positioning operation.

Other changes might be made in the process and in the combination of die and dispersers according to the invention without falling outside the scope of said invention. For example, the dispersers might be so shaped as to have projections and/or cavities along their lateral surfaces in order to anchor the disperser more firmly to the plastic body and to improve the airtightness of the container.

I claim:

1. Process for manufacturing plastic containers incorporating a heat disperser for integrated circuits, consisting in;

working a sheet metal strip so as to form a series of identical flat aligned structures, each comprising a central support area and a number of flat conductors;

welding to each support area a chip of semiconductor material comprising an integrated circuit;

electrically connecting predetermined areas in each integrated circuit to predetermined conductors;

joining to each structure in the sheet metal structure a metal mass, acting as a heat disperser, so that it will adhere to the sheet metal surface opposite to the support area;

placing the sheet metal strip and the heat dispersers in an appropriate die with the dispersers facing the extractors in the die;

injecting into the die under pressure synthetic resin in liquid form;

letting the resin coagulate;

opening the die and operating the extractors, characterized in that the coupling of the heat dispersers to the structures in the sheet metal strip consists in placing a disperser on each outlet hole of the extractors, so as to close it completely, and in placing the prepared sheet metal strip in the die with its free surfaces opposite the support areas in contact with the dispersers.

* * * * *